United States Patent
Lewis et al.

(10) Patent No.: US 7,620,876 B2
(45) Date of Patent: Nov. 17, 2009

(54) REDUCING FALSE POSITIVES IN CONFIGURATION ERROR DETECTION FOR PROGRAMMABLE DEVICES

(75) Inventors: David Lewis, Toronto (CA); Robert Blake, Saratoga, CA (US); Richard G. Cliff, Los Altos, CA (US); Srinivas T. Reddy, Fremont, CA (US)

(73) Assignee: Altera Corporation, San Jose, CA (US)

( * ) Notice: Subject to any disclaimer, the term of this patent is extended or adjusted under 35 U.S.C. 154(b) by 552 days.

(21) Appl. No.: 11/407,519

(22) Filed: Apr. 19, 2006

(65) Prior Publication Data

US 2007/0011578 A1    Jan. 11, 2007

Related U.S. Application Data

(60) Provisional application No. 60/688,980, filed on Jun. 8, 2005.

(51) Int. Cl.
*G11C 29/00* (2006.01)
(52) U.S. Cl. .................. 714/763; 714/725; 714/723; 714/719; 362/38; 362/39
(58) Field of Classification Search ............... 714/763, 714/725, 723, 719; 326/38, 39
See application file for complete search history.

(56) References Cited

U.S. PATENT DOCUMENTS

| 4,369,511 | A | 1/1983 | Kimura et al. |
| 6,553,523 | B1 | 4/2003 | Lindholm et al. |
| 7,257,750 | B1 * | 8/2007 | Singh et al. .................. 714/732 |
| 7,401,280 | B1 * | 7/2008 | Singh et al. .................. 714/732 |

* cited by examiner

*Primary Examiner*—Guy J Lamarre
(74) *Attorney, Agent, or Firm*—Townsend and Townsend and Crew LLP

(57) ABSTRACT

A device reduces false positive memory error detections by using a masking unit and sensitivity mask data to exclude unused portions of the memory from the error detection computations. A device includes an error detection unit to read data from the memory and verify data integrity. The sensitivity mask data indicates unused portions of the memory. Unused portions of the memory may correspond with configuration data for unused portions of a programmable device. Each bit of the sensitivity mask data may indicate the usage of one or more bits of the data from the memory. In response to the mask data, the masking unit sets data from the unused portions of the memory to values that do not change the result of the error detection computations. This prevents any errors in data from the unused portions of the memory from raising an error signal.

39 Claims, 8 Drawing Sheets

REDUCING FALSE POSITIVES IN CONFIGURATION ERROR DETECTION FOR PROGRAMMABLE DEVICES

CROSS-REFERENCES TO RELATED APPLICATIONS

This patent application claims the benefit of U.S. Provisional Patent Application No. 60/688,980, filed Jun. 8, 2005, the disclosure of which is incorporated by reference herein for all purposes. This patent application is related to U.S. patent application Ser. No. 11/340,949, filed Jan. 27, 2006, now U.S. Pat. No. 7,339,816, which is incorporated by reference herein.

BACKGROUND OF THE INVENTION

The present invention relates to the field of programmable devices, and the systems and methods for detecting configuration errors in the same. Programmable devices, such as FPGAs, typically include thousands of programmable logic cells that use combinations of logic gates and/or look-up tables to perform a logic operation. Programmable devices also include a number of functional blocks having specialized logic devices adapted to specific logic operations, such as adders, multiply and accumulate circuits, phase-locked loops, and memory. The logic cells and functional blocks are interconnected with a configurable switching circuit. The configurable switching circuit selectively routes connections between the logic cells and functional blocks. By configuring the combination of logic cells, functional blocks, and the switching circuit, a programmable device can be adapted to perform virtually any type of information processing function.

The functions of a programmable device, such as an FPGA, are usually controlled by configuration data stored in a set of configuration RAM cells (CRAM) or configuration memory. The configuration data in CRAM provides the logic signals used to configure the programmable device to implement its intended functions. Typically, the data in CRAM includes values of look-up tables defining the functions of logic cells; values of control signals for multiplexers and other switching devices used by the configurable switching circuit to route signals between inputs, outputs, logic cells, and functional blocks; and values specifying other aspects of the configuration of the programmable device, such as modes of operation of the programmable device and its assorted functional blocks and logic cells. A copy of the configuration data is typically stored in a non-volatile memory, such as flash memory or ROM, that is within the same chip package as the programmable device or on an external configuration device connected with the programmable memory device. This copy of the configuration data is loaded into the CRAM cells of the programmable device to configure the programmable device to implement the desired functionality.

As the physical dimensions of CRAM cells decrease due to advances in manufacturing processes, the CRAM cells become more susceptible to spontaneous "soft errors." Soft errors may be induced by background radiation, such as alpha particles or cosmic rays, and result in CRAM cells spontaneously changing state from "0" to "1" or vice versa. As the function of the programmable device is determined by the data stored in CRAM cells, even a single change in a CRAM cell's state can change or disable the functions of the programmable device. Additionally, as programmable devices become more complicated and require additional CRAM cells to store their configuration data, the frequency of soft errors increases as well.

Previous solutions to soft errors include error detection circuitry on the programmable device that reads the configuration data from CRAM and generates corresponding error detecting codes. Upon the detection of an error, the error detection circuitry will typically raise an error signal that causes the programmable device to reload its configuration data and be reconfigured for correct operation. In another approach, the configuration data can also include error correcting codes. In conjunction with error detection and correction circuitry, these error correcting codes can be used to correct configuration data in the CRAM without reloading the entire set of configuration data. During the reloading or correcting of configuration data, the programmable device suspends its normal operations.

Many applications effectively do not use large portions of the programmable device's CRAM. For example, a typical application might only use 40% of the CRAM of a programmable device to configure the operation of logic cells, functional blocks, and/or switching circuits that is used by the application. The remaining portion of the CRAM, although set to some logic value, does not affect the functions of the programmable device, as these unused portions of CRAM configure the operation of logic cells, functional blocks, and/or switching circuits that are unused by the application. The portion of the CRAM controlling logic cells, functional blocks, and/or switching circuits that are unused by the application is referred to as an unused portion of the CRAM. Soft errors in unused portions of CRAM are insignificant and should be ignored.

Because error detection circuitry does not distinguish between the used and unused portions of the CRAM, previous programmable devices generally reloaded configuration data upon detection of any error in the CRAM. However, as large portions of the CRAM may be unused by applications of the programmable device, many of these soft errors are "false positives" that have no effect on the functionality of the programmable device. Thus, programmable devices are often unnecessarily reloading configuration data due to false positives, which diminishes the performance of the programmable device due to downtime during the loading of configuration data and increased power consumption from unnecessary loading and storing of configuration data.

It is therefore desirable for an apparatus and method to detect false positive soft errors so as to avoid unnecessary reloading and reconfiguration of programmable devices.

BRIEF SUMMARY OF THE INVENTION

In an embodiment of the invention, a device reduces false positive memory error detections by using a masking unit and sensitivity mask data to exclude unused portions of the memory from the error detection computations. A device includes an error detection unit to read data from the memory and verify data integrity. The sensitivity mask data indicates unused portions of the memory. Unused portions of the memory may correspond with configuration data for unused portions of a programmable device. Each bit of the sensitivity mask data may indicate the usage of one or more bits of the data from the memory. In response to the mask data, the masking unit sets data from the unused portions of the memory to values that do not change the result of the error detection computations. This prevents any errors in data from the unused portions of the memory from raising an error signal.

In an embodiment, a method of testing the integrity of data stored in a memory includes retrieving first data from the memory and applying mask data to the first data to produce second data. The mask data is adapted to exclude at least a portion of the first data from an error detection computation. The method also includes performing an error detection computation on the second data to determine an error detection result, evaluating the error detection result to determine if at least one significant error exists in the first data, and outputting an error signal in response to the determination that at least one significant error exists in the first data.

In an additional embodiment, the error detection computation is adapted to detect at least one soft error. In a further embodiment, the mask data is adapted to set the excluded portion of the first data to a value that does not effect the error detection computation. In another embodiment, the excluded portion of the first data corresponds with a portion of the memory not used to store useful data. In still a further embodiment, the portion of the memory is adapted to store configuration data for an unused portion of a programmable device.

In an embodiment, the mask data includes a plurality of mask bits, each mask bit corresponding with a bit of the first data. In another embodiment, the mask data includes a plurality of mask bits, each mask bit corresponding with a plurality of bits of the first data. In embodiments, each plurality of bits of the first data may have the same size and/or a plurality of bits of the first data may correspond with configuration data associated with a resource of the programmable device.

BRIEF DESCRIPTION OF THE DRAWINGS

The invention will be described with reference to the drawings, in which.

DETAILED DESCRIPTION OF THE INVENTION

Figure 1:
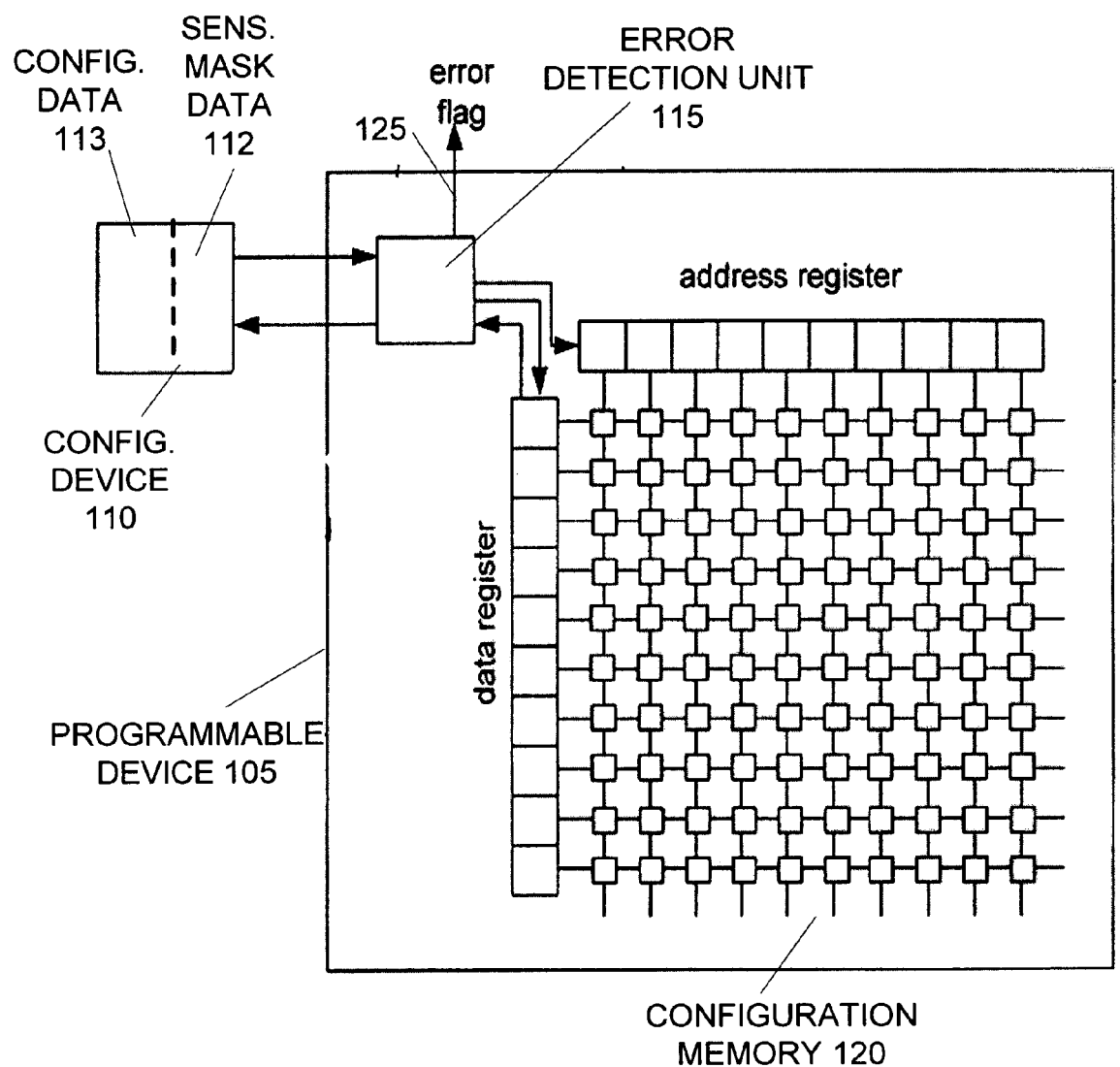
FIG. 1 illustrates a system of detecting soft errors in a programmable device according to an embodiment of the invention.

FIG. 1 illustrates a system 100 of detecting soft errors in a programmable device according to an embodiment of the invention. System 100 includes a programmable device 105 connected with a configuration device 110. Programmable device 105 includes configuration memory 120 used to store configuration data that defines the functions of the programmable device. The configuration device 110 stores a copy 113 of the configuration data in non-volatile memory. Following the activation or reset of the programmable device 105, the configuration device 110 is adapted to provide its copy 113 of the configuration data to the programmable device 105 for storage in its configuration memory 120.

To detect the occurrence of soft errors, programmable device 105 includes an error detection unit 115. The error detection unit 115 is initialized with a checksum value or other type of code used to verify data integrity. The error detection unit 115 reads all of the configuration data from the configuration memory 120 and performs an error detection calculation, such as a cyclic redundancy check (CRC) or any other error detecting algorithm known to one of skill in the art. After the error detection unit 115 has completed its error detection calculation on all of the configuration data in the configuration memory 120, the error detection unit compares the resulting value of this calculation with the checksum value. If these values do not match, then a soft error has occurred and the error detection unit 115 generates an error flag on output 125. In response to the error flag, embodiments of the programmable device reload configuration data from the configuration device. In an embodiment, the error detecting unit 115 repeats the error detecting calculation repeatedly to continuously screen for soft errors.

As discussed above, many configurations of the programmable device 105 do not use large portions of the configuration memory 120. To prevent the occurrence of false positives, which are soft errors in the unused portions of the configuration memory 120 that unnecessarily raise an error flag, an embodiment of the error detection unit 115 incorporates sensitivity mask data in its error detection calculations. Sensitivity mask data specifies which portions of the configuration memory 120 are used to specify the current configuration of a programmable device.

In an embodiment, sensitivity mask data 112 is stored in a portion of the configuration device 110. The error detection unit 115 retrieves sensitivity mask data 112 as needed from the configuration device 110. The error detection unit 115 uses the sensitivity mask data to exclude unused portions of the configuration memory 120 from its error detection calculations. As a result, soft errors occurring in unused portions of the configuration memory will not affect the error detection calculations, and therefore will not cause an error flag to be raised. Depending on the granularity of the sensitivity mask data, this substantially reduces or eliminates the occurrence of false positives arising from soft errors in unused portions of the configuration memory 120.

Figure 2:
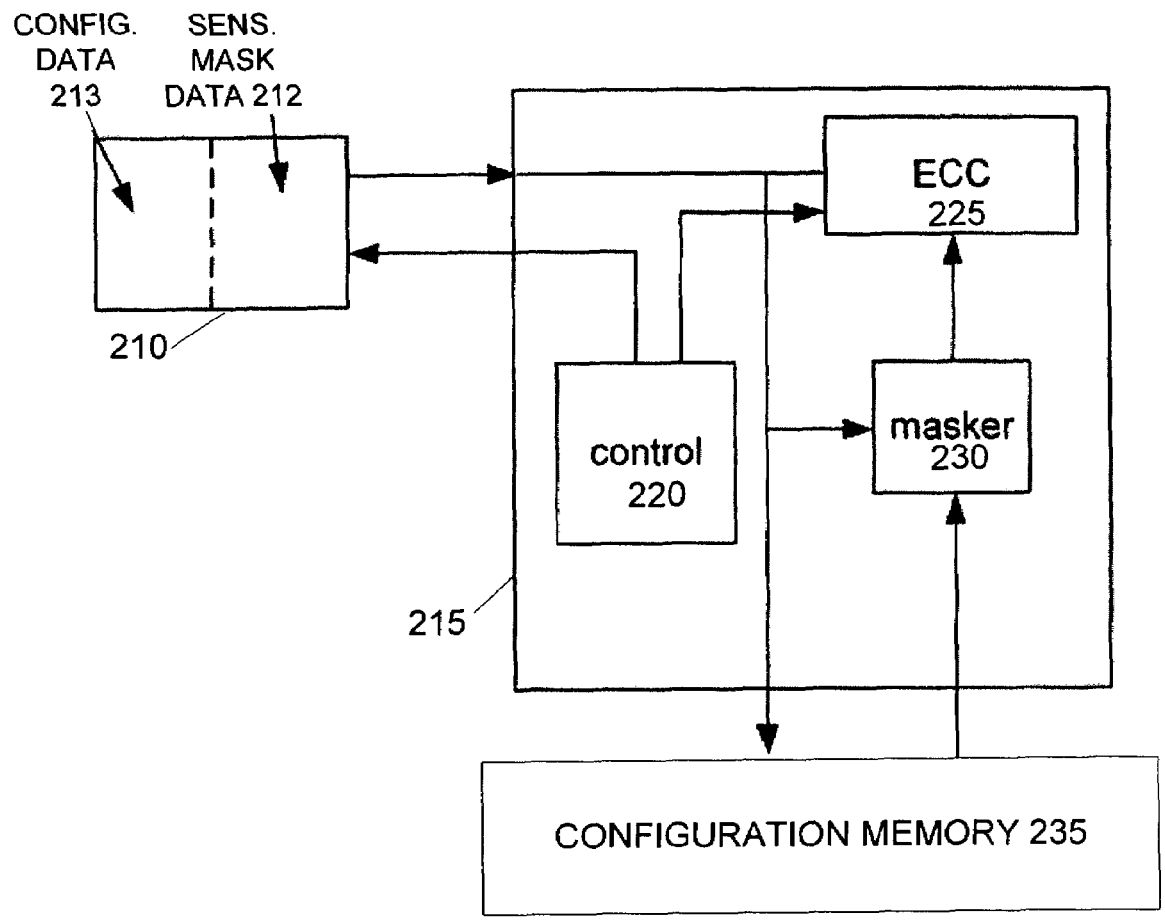
FIG. 2 illustrates details of a system of detecting soft errors in a programmable device according to an embodiment of the invention.

FIG. 2 illustrates details 200 of a system of detecting soft errors in a programmable device according to an embodiment of the invention. An error detection unit 215 includes a control unit 220, an error detection code generator 225, and a masker unit 230. In this embodiment, the error detection unit continuously reads and tests the configuration data stored in the configuration memory 235 of the programmable device. To accomplish this, the control unit 220 issues a command to retrieve a portion of the configuration data stored in the configuration memory 235. The control unit 220 also retrieves a portion of the sensitivity mask data 212 stored in configuration device 210. In an alternate embodiment, sensitivity mask data 212 can be stored in a portion of the configuration memory 235. In this embodiment, the sensitivity mask data 212 itself should be included in the error detection computation as well as for masking other configuration data. The portion of the sensitivity mask data 212 corresponds with the retrieved portion of the configuration data stored in the configuration memory 235 of the programmable device. In yet another embodiment, the sensitivity mask data may 212 may be stored in a different memory than configuration data 213. In this embodiment, sensitivity mask data 212 may be communicated with the programmable device using different I/O pins and/or a different memory interface as that used for configuration data 213.

The retrieved portion of the configuration data and corresponding portion of the sensitivity mask data 212 are directed to masker unit 230. The masker unit 230 uses the sensitivity mask data to mask off or eliminate the contribution of unused portions of the configuration memory to the error detection calculations. The output of the masker unit 230 is directed to the error detection code generator 225, which performs an error detection calculation, such as a checksum or CRC code. When the error detection code generator 225 has completed its error detection calculation for all of the configuration data in the configuration memory 235, the resulting error detection code can be evaluated by the control unit 220 to determine if an error has occurred.

In an embodiment, unused portions of the configuration memory 235 are set to a value of "0". Used portions of the configuration memory 235 may be set to "0" or "1", depending upon the desired function of the programmable device. Portions of the sensitivity mask data corresponding with used portions of the sensitivity mask are set to a "1", while portions of the sensitivity mask data corresponding with unused portions of the sensitivity mask are set to "0." As discussed in detail below, the sensitivity mask data can be generated in conjunction with the generation of configuration data for a programmable device.

In an embodiment, the masker unit 230 applies a Boolean operation, such as an AND, between retrieved configuration data and corresponding sensitivity mask data. If the retrieved configuration data is from a used portion of the configuration memory 235, the corresponding sensitivity mask data will be a "1". The Boolean AND of a "1", from the sensitivity mask, and the retrieved configuration data will leave the configuration data unchanged. The masker unit 230 will output the resulting data, which in this case is the unchanged configuration data, to the error detection code generator 225.

If the retrieved configuration data is from an unused portion of the configuration memory 235, the corresponding sensitivity mask data will be a "0". The Boolean AND of a "0", from the sensitivity mask, and the retrieved configuration data will always result in a "0". Normally, the unused portions of the configuration memory 235 are set to "0". Thus, the resulting "0" data from the masker unit 230 for unused portions of the configuration memory 235 will still be "0". If a soft error occurs in an unused portion of the configuration memory 235, a "0" will be changed to a "1". However, the corresponding sensitivity mask data will still have a value of "0". Thus, the output of the masker unit will still be "0".

Because the masker unit 230 will always output a "0" for configuration data from unused portions of the configuration memory 235, the results of the error detection calculation will be unchanged regardless of any soft errors in unused portions of the configuration memory 235. Thus, false positives from soft errors in unused portions of the configuration memory 235 will be substantially reduced or eliminated.

Figure 3A:
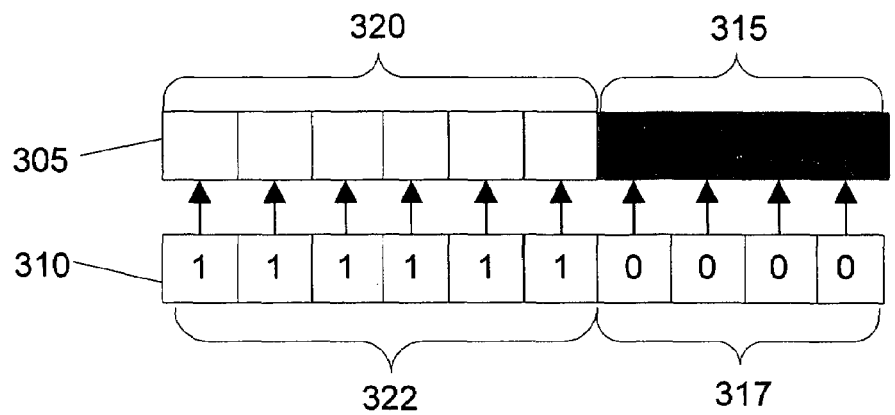
FIGS. 3A-3C illustrate example arrangements of sensitivity mask data used to reduce the occurrence of false positives in detecting soft errors in a programmable device according to an embodiment of the invention.
Figure 3B:
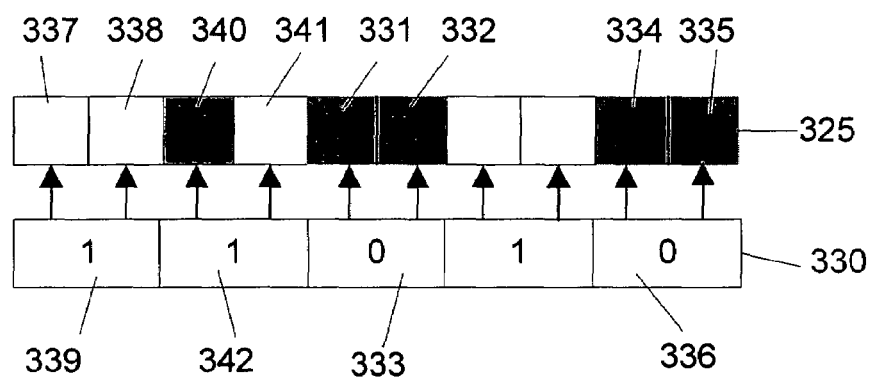
Figure 3C:
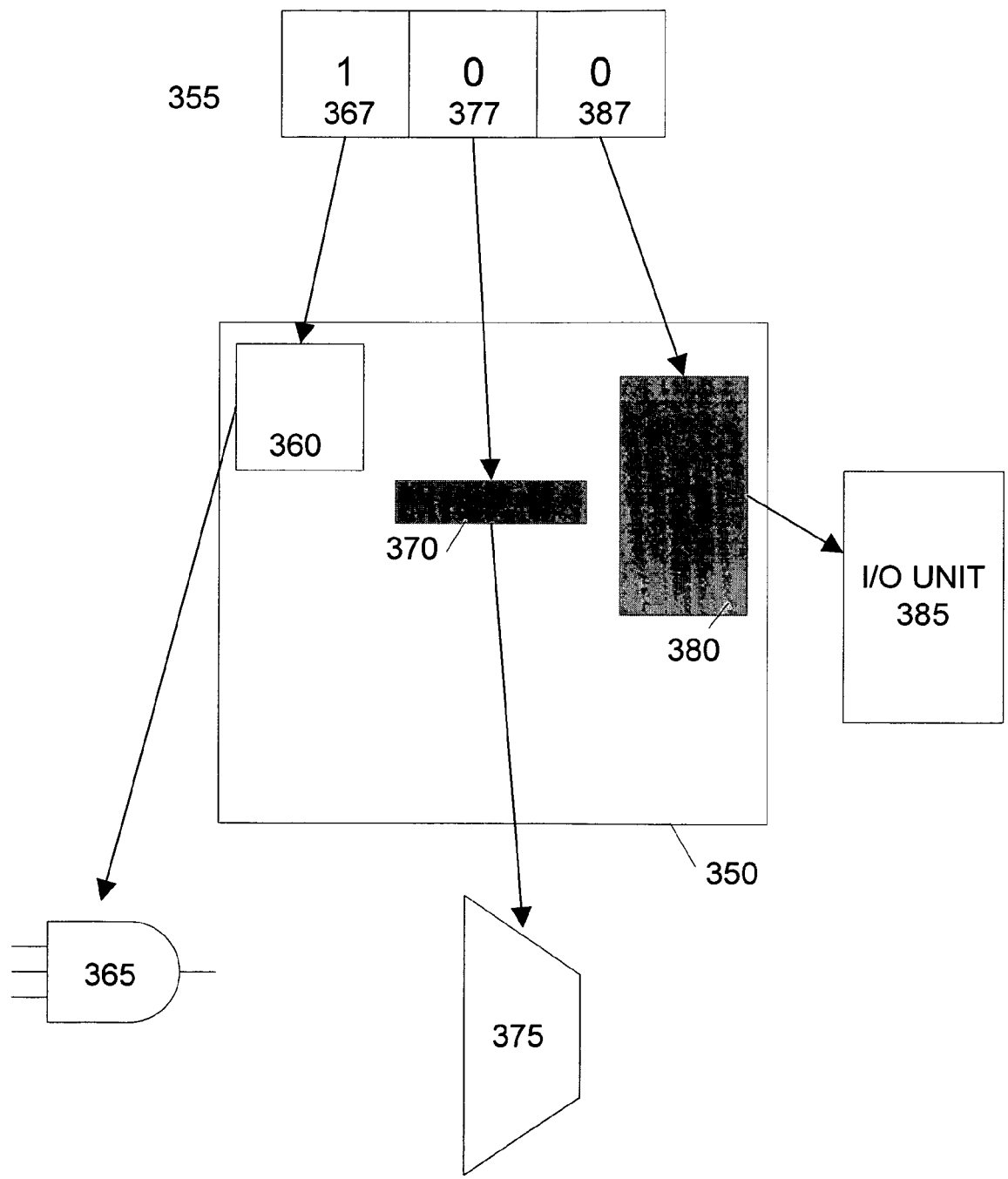

FIGS. 3A-3C illustrate example arrangements of mask data used to reduce the occurrence of false positives in detecting soft errors in a programmable device according to an embodiment of the invention. FIG. 3A illustrates a portion of a configuration memory 305 and a corresponding portion of a sensitivity mask 310. In this example, each bit of the sensitivity mask corresponds with a single bit of the configuration memory. If bits 315 of configuration memory 305 are unused, then corresponding bits 317 of the sensitivity mask 310 are set to "0". Similarly, if bits 320 of the configuration memory 305 are used to specify the configuration of the programmable device, then corresponding bits 322 of the sensitivity mask 310 are set to "1".

FIG. 3B illustrates a portion of a configuration memory 325 and a corresponding portion of a sensitivity mask 330. In this example, each bit of the sensitivity mask corresponds with a pair of bits of the configuration memory 325. If bits 331 and 332 of configuration memory 325 are unused, then corresponding bit 333 of the sensitivity mask 330 is set to "0". If bits 334 and 335 of configuration memory 325 are unused, then corresponding bit 336 of the sensitivity mask 330 is set to "0". Conversely, if bits 337 and 338 of the configuration memory 325 are used to specify the configuration of the programmable device, then corresponding bit 339 of the sensitivity mask 330 is set to "1". Additionally, if only one of a pair of bits in the configuration memory is used, the corresponding bit of the sensitivity mask must still be set to "1". Thus, because bit 340 is unused but bit 341 is used, but 342 of the sensitivity mask 342 is set to "1". In a further embodiment of the example of FIG. 3B, a sensitivity bit will correspond with the bits of a two-dimensional region of the configuration memory, such as a rectangle of one or more rows configuration memory bits and of one or more columns of configuration memory bits.

FIG. 3C illustrates a portion of a configuration memory 350 and a corresponding portion of a sensitivity mask 355. In this embodiment, each bit of the sensitivity mask corresponds with a resource of the programmable device, such as a specific logic cell, functional block, I/O unit, memory unit, MAC unit, or multiplexer. If a programmable device configuration does not use a given resource of a programmable device, then the sensitivity mask bit corresponding with this resource is set to "0". In this embodiment, each sensitivity mask bit can correspond with a variable number of bits of the configuration memory 350, depending upon the number of bits associated with the underlying programmable device resource. For example, if one or more bits 360 of the configuration memory 350, which specify the configuration of logic cell 365 are used, then bit 367 of the sensitivity mask 355 is set to "1". Conversely, one or more bits 370, which specify the configuration of multiplexer 375, and one or more bits 380, which specify the configuration of I/O unit 385, are unused; therefore bits 377 and 387 of the sensitivity mask 355 are set to "0".

Figure 4:
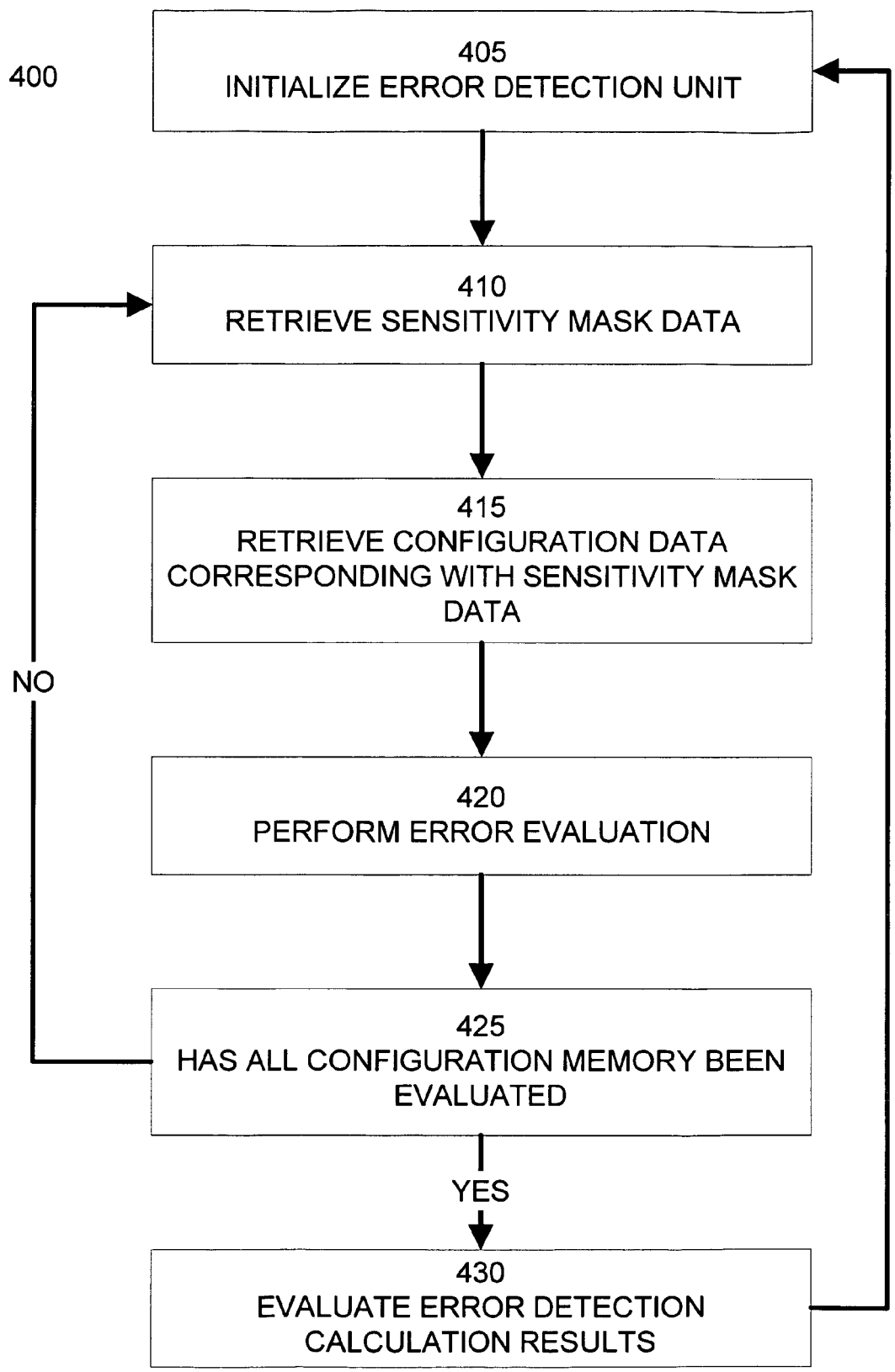
FIG. 4 illustrates a method of detecting soft errors in the configuration data of a programmable device according to an embodiment of the invention.

FIG. 4 illustrates a method 400 of detecting soft errors in the configuration data of a programmable device according to an embodiment of the invention. Step 405 initializes the error detection unit. Step 405 can include resetting an error detection code value and loading a desired error detection result, such as the correct checksum or CRC value, into the error detection unit.

Step 410 retrieves a portion of the sensitivity mask data. In an embodiment, step 410 retrieves sensitivity mask data from a configuration device. In another embodiment, the sensitivity mask data is stored in the programmable device itself, either in a portion of the configuration memory or another memory unit of the programmable device. In another embodiment the sensitivity mask data is stored in some other memory external to the programmable device.

Step 415 retrieves a portion of the configuration data corresponding with the sensitivity mask data retrieved in step 410. Step 420 performs an error evaluation of the configuration data. An embodiment of step 420 can include masking the retrieved configuration data with the sensitivity mask data to reduce the likelihood of false positives, as described above. Step 420 performs an error detection computation on the resulting masked configuration data. The results of the error detection computation can be accumulated with previously computed error detection operations to determine an error detection code for the entire configuration memory.

Step 425 determines if the all of the configuration data in the configuration memory has been evaluated. If not, then method 400 returns to step 410 and repeats steps 410 through 425 for the remaining portions of the configuration memory. Conversely, if all of the configuration data in the configuration memory has been evaluated, method 400 proceeds to step 430. Step 430 evaluates the results of the error detection computation. In an embodiment, step 430 compares the results of the error detection computation with a desired error detection result. If these two values do not match, then a soft error has occurred and an error flag signal is raised. Following step 430, method 400 may be repeated to continually monitor the configuration data for soft errors and to generate an error flag if a soft error is detected.

Embodiments of method 400 frequently access the sensitivity mask data. If the sensitivity mask data is stored outside of the programmable device, such as in a configuration device, then power consumption may increase due to the amount of external data bus traffic. A further embodiment of the invention reduces the frequency of sensitivity mask data access to reduce power consumption.

Figure 5:
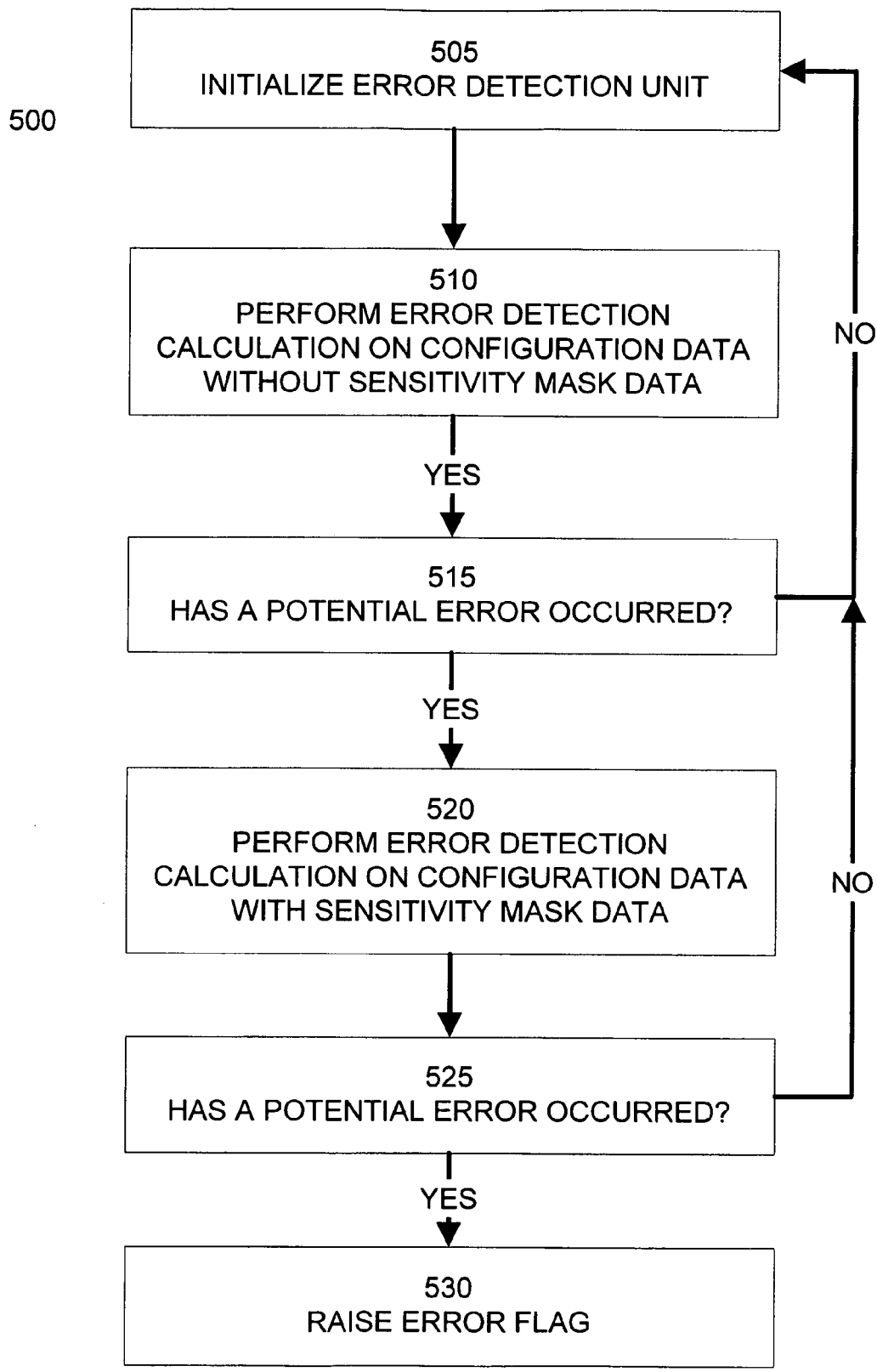
FIG. 5 illustrates a method of detecting soft errors in the configuration data of a programmable device according to a further embodiment of the invention.

FIG. 5 illustrates a method 500 of detecting soft errors in the configuration data of a programmable device according to a further embodiment of the invention. Step 505 initializes the error detection unit in a manner similar to step 405. Step 510 performs an error detection computation on all of the configuration data in the configuration memory of the programmable device. Step 510 does not use any sensitivity mask data to perform this computation.

Step 515 evaluates the results of the error detection computation. If no error is detected in the configuration data, an embodiment method 500 returns to step 505 and repeats steps 505, 510, and 515 as needed to monitor the configuration memory for soft errors.

Conversely, if step 515 determines that a soft error has occurred, method 500 proceeds to step 520. Step 520 is used to determine whether the soft error previously detected in step 515 occurred in a used or unused portion of the configuration memory. Step 520 performs an error detection computation on all of the configuration data in the configuration memory of the programmable device using the sensitivity mask data. In an embodiment, step 520 is performed in a manner similar to method 400.

Following step 520, step 525 evaluates the results of step 520 to determine if a soft error has occurred. If the results of step 520 indicate that a soft error has occurred, then method 500 proceeds to step 530 to issue an error flag, indicating that the configuration data of the programmable device should be reloaded. If the results of step 520 do not detect a soft error, then the soft error detected by step 515 occurred in an unused portion of the configuration memory. Thus, this error can be ignored and method 500 proceeds from step 525 back to step 505 for further monitoring of the configuration data. Furthermore, power consumption is reduced as sensitivity mask data is only accessed after the detection of a potential soft error.

Figure 6:
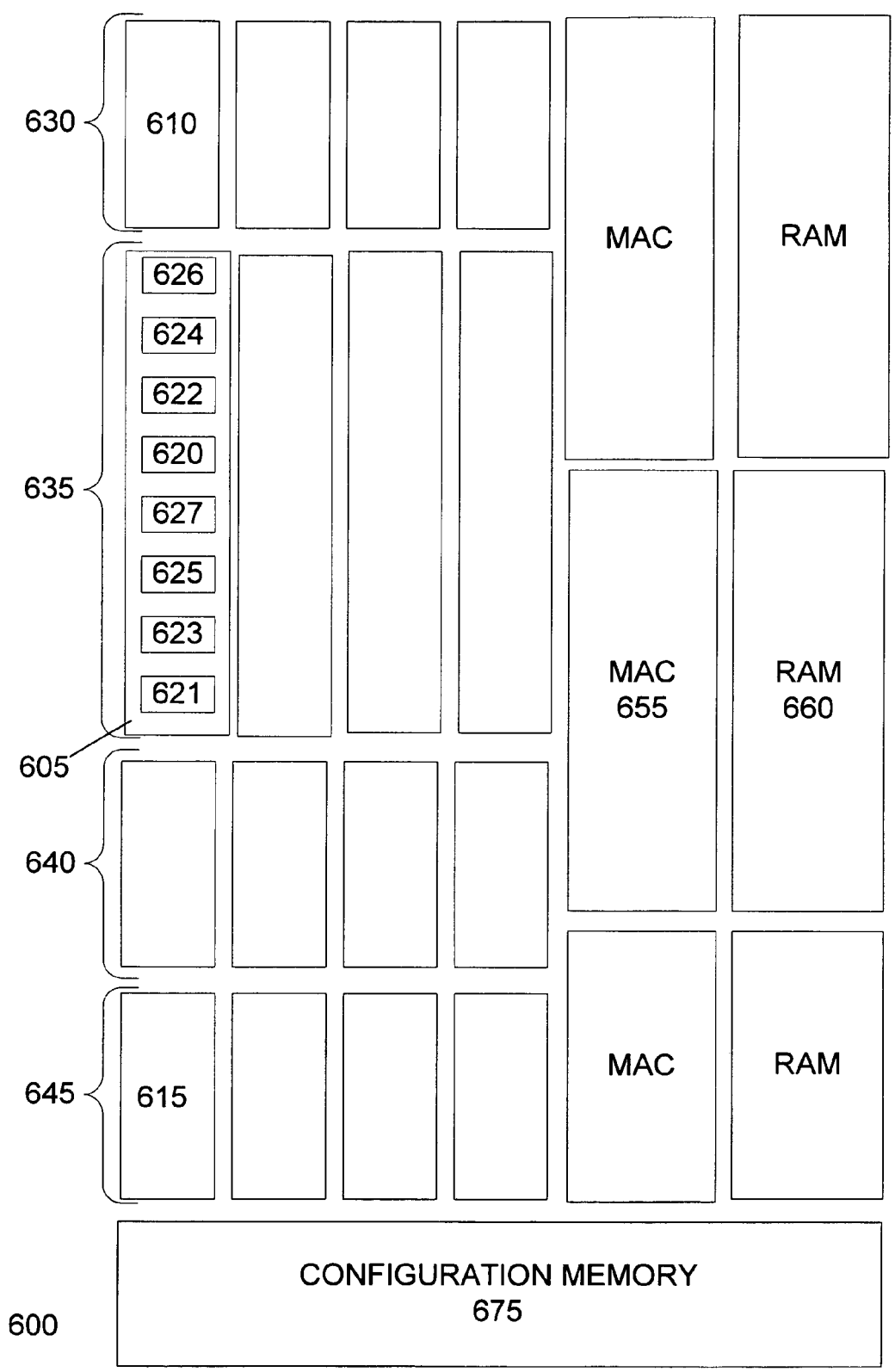
FIG. 6 illustrates an example programmable device suitable for implementing an embodiment of the invention.

FIG. 6 illustrates an example programmable device suitable for implementing an embodiment of the invention. Programmable device 600 includes a number of logic array blocks (LABs), such as LABs 605, 610, 615. The LABs of device 600 are arranged into rows 630, 635, 640, and 645, not shown to scale in FIG. 6. Each LAB includes a number of programmable logic cells that use logic gates and/or look-up tables to perform logic operations, as well as registers to store and retrieve data. LAB 605 illustrates in detail logic cells 620, 621, 622, 623, 624, 625, 626, and 627. Logic cells are omitted from other LABs in FIG. 6 for clarity. In an embodiment, the arrangement of logic cells within a LAB and of LABs within rows provides a hierarchical system of configurable connections of a programmable switching circuit, in which connections between logic cells within a LAB, between cells in different LABs in the same row, and between cells in LABs in different rows require progressively more resources.

In addition to logic cells arranged in LABs, programmable device 600 also include specialized functional blocks, such as multiply and accumulate block (MAC) 655 and random access memory block (RAM) 660. The configuration of the programmable device is specified at least in part by configuration data stored in configuration memory 675. The configuration data can include values for lookup tables defining the functions of logic cells; values of control signals for multiplexers and other switching devices used by the configurable switching circuit to route signals between inputs, outputs, logic cells, and functional blocks; and values specifying other aspects of the configuration of the programmable device, such as modes of operation of the programmable device and its assorted functional blocks and logic cells. Although the configuration memory 675 is shown in FIG. 6 as a monolithic unit, in some programmable devices, configuration memory 675 is physically distributed in a range of locations over the programmable device. In these types of programmable devices, portions of the configuration memory can lie within the logic cells, functional blocks, and configurable switching circuit of the programmable device.

For clarity, the portion of the programmable device 600 shown in FIG. 6 only includes a small number of logic cells, LABs, and functional blocks. Typical programmable devices will include thousands or tens of thousands of these elements. In some implementations, the error detection unit discussed above can be implemented as a dedicated functional block. In other implementations, all or a portion of the error detection unit can be implemented using logic cells and other programmable resources of the programmable device 600.

Figure 7:
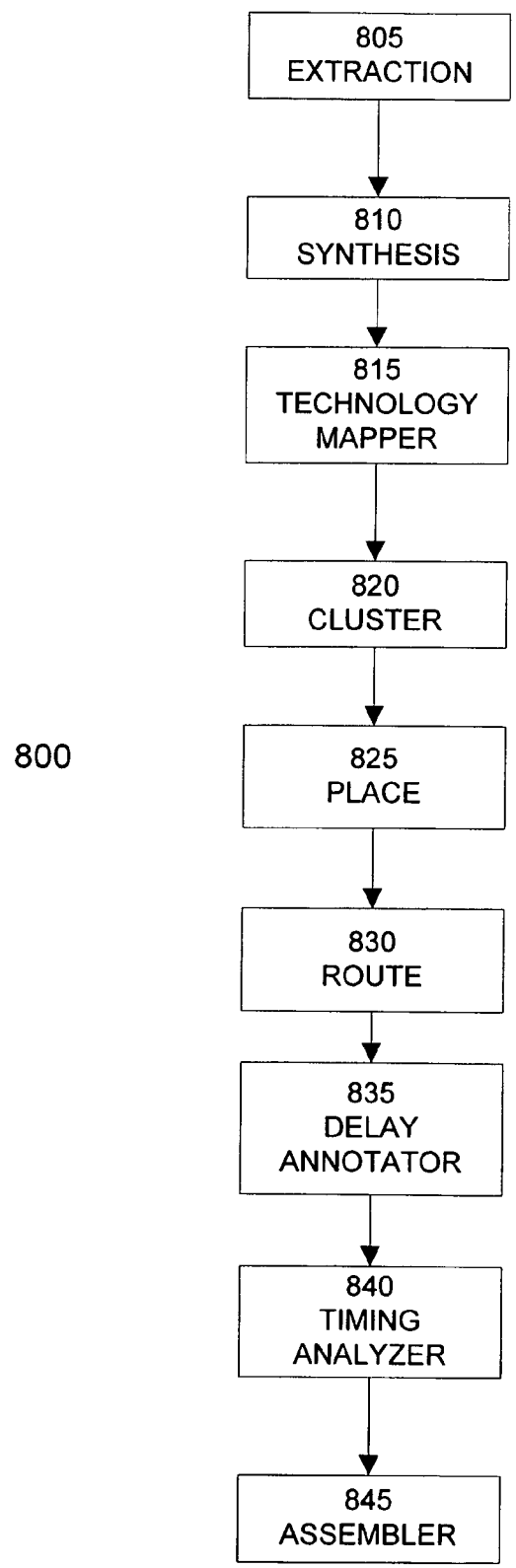
FIG. 7 illustrates an example compilation process used to create configuration data and mask data for use with embodiments of the invention.

FIG. 7 illustrates an example compilation process 800 suitable for creating configuration data for use with an embodiment of the invention. The compilation process 800 converts a user design into a programmable device configuration adapted to configure a programmable device to implement the user design. The extraction phase 805 converts a description of the user design, expressed for example in a hardware description language, into a register transfer layer description.

Synthesis phase 810 converts the register transfer layer description of the user design into a set of logic gates. Embodiments of the synthesis phase 810 can select between equivalent logic gates to improve resistance to soft errors, as described above. Technology mapping phase 815 subdivides the set of logic gates into a set of atoms, which are groups of logic gates matching the capabilities of the logic cells or other functional blocks of the programmable device. A given user design may be converted into any number of different sets of atoms, depending upon the underlying hardware of the programmable device used to implement the user design.

Following the technology mapping phase 815, the cluster phase 820 groups related atoms together into clusters. The place phase 825 assigns clusters of atoms to locations on the programmable device. The route phase 830 determines the configuration of the configurable switching circuit of the programmable device used to connect the atoms implementing the user design.

The delay annotator phase 835 determines the signal delays for the set of atoms and their associated connections in the configurable switching circuit using a timing model of the programmable device. The timing analysis phase 840 determines the maximum operating speed of the programmable device when implementing the user design, for example by determining the portions of the user design have the largest signal delay.

The assembler phase 845 generates a set of configuration information specifying the configuration of the programmable device implementing the user design, including the configuration of each of the logic cells used to implement the user design and the configuration of the configurable switching circuit used to connect the logic cells. In an embodiment, the assembler phase 845 also generates sensitivity mask data corresponding with the configuration data. In this embodiment, assembler phase identifies the portions of the configuration memory used by the user design and sets sensitivity mask data accordingly. The assembler phase 845 can write the configuration information to a configuration file, which can then be used to configure one or more programmable devices to implement instances of the user design.

Further embodiments can be envisioned to one of ordinary skill in the art after reading the attached documents. For example, although the invention has been discussed with reference to programmable devices, it is equally applicable to any type of digital device in which data integrity needs to be preserved against soft errors, including standard or structured ASICs, gate arrays, and general digital logic devices. In other embodiments, combinations or sub-combinations of the above disclosed invention can be advantageously made. The block diagrams of the architecture and flow charts are grouped for ease of understanding. However it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A method of testing the integrity of data stored in a memory, the method comprising:
   retrieving first data from the memory;
   applying mask data to the first data to produce second data, wherein the mask data is adapted to exclude at least a portion of the first data from an error detection computation, and wherein one bit of mask data corresponds to a plurality of bits of first data;
   performing an error detection computation on the second data to determine an error detection result;
   evaluating the error detection result to determine if at least one significant error exists in the first data; and
   outputting an error signal in response to the determination that at least one significant error exists in the first data.

2. The method of claim 1, wherein the error detection computation is adapted to detect at least one soft error.

3. The method of claim 1, wherein the mask data is adapted to set the excluded portion of the first data to a value that does not affect the error detection computation.

4. The method of claim 1, wherein the excluded portion of the first data corresponds with a portion of the memory not used to store useful data.

5. The method of claim 4, wherein the portion of the memory is adapted to store configuration data for an unused portion of a programmable device.

6. The method of claim 1, wherein the mask data includes a plurality of mask bits, each mask bit corresponding with a bit of the first data.

7. The method of claim 1, wherein the mask data includes a plurality of mask bits and at least one mask bit corresponds with a plurality of bits of the first data.

8. The method of claim 7, wherein each plurality of bits of the first data has the same size.

9. The method of claim 7, wherein at least one plurality of bits of the first data associated with a mask bit corresponds with configuration data associated with a resource of the programmable device.

10. The method of claim 1, wherein applying mask data includes:
    retrieving mask data from mask data memory; and
    performing a Boolean operation between a bit of the mask data and at least one corresponding bit of the first data.

11. The method of claim 10, wherein the Boolean operation is an AND operation.

12. The method of claim 10, wherein the mask data memory is included in the memory.

13. The method of claim 10, wherein the mask data memory is included in a separate memory accessible via an external data bus.

14. The method of claim 1, wherein the masking unit includes logic adapted to perform a Boolean operation between a bit of the mask data and at least one corresponding bit of the first data.

15. The method of claim 1 wherein performing an error detection computation comprises performing a cyclic redundancy check.

16. A method of testing the integrity of data stored in a memory, the method comprising:
    retrieving first data from the memory;
    performing an error detection computation on the first data to determine an error detection result;
    evaluating the error detection result to determine if at least one error exists in the first data; and
    in response to a determination that at least one error exists in the first data:
    applying mask data to the first data to produce second data, wherein the mask data is adapted to exclude at least a portion of the first data from an error detection computation;
    performing an error detection computation on the second data to determine an error detection result;
    evaluating the error detection result to determine if at least one significant error exists in the first data; and
    outputting an error signal in response to the determination that at least one significant error exists in the first data.

17. The method of claim 16, wherein the error detection computation is adapted to detect at least one soft error.

18. The method of claim 16, wherein the mask data is adapted to set the excluded portion of the first data to a value that does not affect the error detection computation.

19. The method of claim 16, wherein the excluded portion of the first data corresponds with a portion of the memory not used to store useful data.

20. The method of claim 19, wherein the portion of the memory is adapted to store configuration data for an unused portion of a programmable device.

21. The method of claim 16, wherein the mask data includes a plurality of mask bits, each mask bit corresponding with a bit of the first data.

22. The method of claim 16, wherein the mask data includes a plurality of mask bits and at least one mask bit corresponds with a plurality of bits of the first data.

23. The method of claim 22, wherein each plurality of bits of the first data has the same size.

24. The method of claim 22, wherein at least one plurality of bits of the first data associated with a mask bit corresponds with configuration data associated with a resource of the programmable device.

25. The method of claim 16, wherein applying mask data includes:
   retrieving mask data from mask data memory; and
   performing a Boolean operation between a bit of the mask data and at least one corresponding bit of the first data.

26. The method of claim 25, wherein the Boolean operation is an AND operation.

27. The method of claim 25, wherein the mask data memory is included in the memory.

28. The method of claim 25, wherein the mask data memory is included in a separate memory accessible via an external data bus.

29. The method of claim 16 wherein performing an error detection computation comprises performing a cyclic redundancy check.

30. The method of claim 16 wherein one bit of mask data corresponds to a plurality of bits of first data.

31. A system for testing the integrity of data stored in a memory, the system comprising:
   a control unit;
   a first interface adapted to retrieve first data from a memory in response to a first signal from the control unit;
   a second interface adapted to retrieve mask data from a second memory in response to a second signal from the control unit;
   a masking unit connected with the first and second interfaces and including logic adapted to apply the mask data to the first data, thereby creating second data, wherein the masking unit includes logic adapted to exclude at least a portion of the first data from an error detection computation; and
   an error detection computation unit connected with the masking unit and including logic adapted to perform the error detection computation on the second data to determine an error detection result, the error detection computation comprising a cyclic redundancy check;
   wherein the control unit includes logic adapted to evaluate the error detection result to determine if at least one significant error exists in the first data and logic adapted to output an error signal in response to the determination that at least one significant error exists in the first data.

32. The system of claim 31, wherein the masking unit is adapted to set the excluded portion of the first data to a value that does not affect the error detection computation in response to the mask data.

33. The system of claim 31, wherein the excluded portion of the first data corresponds with a portion of the memory not used to store useful data.

34. The system of claim 33, wherein the portion of the memory is adapted to store configuration data for an unused portion of a programmable device.

35. The system of claim 31, wherein the mask data includes a plurality of mask bits, and the masking unit includes logic adapted to apply each mask bit to a corresponding bit of the first data.

36. The system of claim 31, wherein the mask data includes a plurality of mask bits, and the masking unit includes logic adapted to apply at least one of the plurality of mask bits to a corresponding plurality of bits of the first data.

37. The system of claim 36, wherein each corresponding plurality of bits of the first data has the same size.

38. The system of claim 36, wherein at least one corresponding plurality of bits of the first data corresponds with configuration data associated with a resource of the programmable device.

39. The system of claim 31 wherein one bit of mask data corresponds to a plurality of bits of first data.

* * * * *

UNITED STATES PATENT AND TRADEMARK OFFICE
CERTIFICATE OF CORRECTION

PATENT NO.      : 7,620,876 B2                                    Page 1 of 1
APPLICATION NO. : 11/407519
DATED           : November 17, 2009
INVENTOR(S)     : Lewis et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 764 days.

Signed and Sealed this

Fourteenth Day of December, 2010

David J. Kappos
*Director of the United States Patent and Trademark Office*